(12) United States Patent
Kihara et al.

(10) Patent No.: US 9,911,607 B2
(45) Date of Patent: Mar. 6, 2018

(54) METHOD OF PROCESSING TARGET OBJECT

(71) Applicant: TOKYO ELECTRON LIMITED, Tokyo (JP)

(72) Inventors: Yoshihide Kihara, Miyagi (JP); Toru Hisamatsu, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/863,863

(22) Filed: Sep. 24, 2015

(65) Prior Publication Data

US 2016/0099148 A1   Apr. 7, 2016

(30) Foreign Application Priority Data

Oct. 7, 2014   (JP) ................................ 2014-206602

(51) Int. Cl.
*H01L 21/033* (2006.01)
*H01L 21/311* (2006.01)
(Continued)

(52) U.S. Cl.
CPC ........ *H01L 21/0338* (2013.01); *C23C 16/401* (2013.01); *C23C 16/402* (2013.01); *C23C 16/4554* (2013.01); *C23C 16/45525* (2013.01); *C23C 16/45553* (2013.01); *H01L 21/0228* (2013.01); *H01L 21/0276* (2013.01); *H01L 21/02164* (2013.01); *H01L 21/02274* (2013.01); *H01L 21/0332* (2013.01);
(Continued)

(58) Field of Classification Search
None
See application file for complete search history.

(56) References Cited

U.S. PATENT DOCUMENTS

2006/0037701 A1* 2/2006 Koshiishi .......... H01J 37/32082
                                                    156/345.44
2006/0210723 A1* 9/2006 Ishizaka .................. C23C 16/12
                                                    427/569
(Continued)

FOREIGN PATENT DOCUMENTS

CN       101542685 A    9/2009
WO    2008067228 A1    6/2008
(Continued)

OTHER PUBLICATIONS

Julien Beynet et al., "Low temperature plasma-enhanced ALD enables cost effective spacer defined double patterning (SDDP)", Proc. of SPIE vol. 7520, Lithography Asia 2009, Dec. 12, 2009, 7 pages.

Primary Examiner — Jiong-Ping Lu
(74) Attorney, Agent, or Firm — Brundidge & Stanger, P.C.

(57) ABSTRACT

A controllability of a size of a mask can be improved in a multi-patterning method. A process of forming a silicon oxide film on a first mask and an antireflection film is performed. In this process, plasma of a first gas including a silicon halide gas and plasma of a second gas including an oxygen gas are alternately generated. Then, a region of the silicon oxide film is removed such that only a region along a side wall of the first mask is left, and then, the first mask is removed and the antireflection film and an organic film is etched.

10 Claims, 12 Drawing Sheets

(51) Int. Cl.

| | | |
|---|---|---|
| *H01L 21/027* | (2006.01) | |
| *H01L 21/02* | (2006.01) | |
| *H01L 21/308* | (2006.01) | |
| *H01L 21/3213* | (2006.01) | |
| *C23C 16/455* | (2006.01) | |
| *C23C 16/40* | (2006.01) | |

(52) U.S. Cl.
CPC ...... *H01L 21/0335* (2013.01); *H01L 21/0337* (2013.01); *H01L 21/3086* (2013.01); *H01L 21/31116* (2013.01); *H01L 21/31144* (2013.01); *H01L 21/32139* (2013.01)

(56) References Cited

U.S. PATENT DOCUMENTS

| | | |
|---|---|---|
| 2006/0281337 A1 | 12/2006 | Matsuura |
| 2008/0081104 A1 | 4/2008 | Hasebe et al. |
| 2008/0122125 A1* | 5/2008 | Zhou .................. H01L 21/3088 257/797 |
| 2011/0065280 A1 | 3/2011 | Nakajima et al. |
| 2011/0244691 A1* | 10/2011 | Mochiki ........... H01J 37/32091 438/710 |
| 2013/0314015 A1 | 11/2013 | Hoshi et al. |
| 2014/0134812 A1 | 5/2014 | Kim et al. |

FOREIGN PATENT DOCUMENTS

| | | |
|---|---|---|
| WO | 2009/101878 A1 | 8/2009 |
| WO | 2012108079 A1 | 8/2012 |
| WO | 2013125523 A1 | 8/2013 |

* cited by examiner

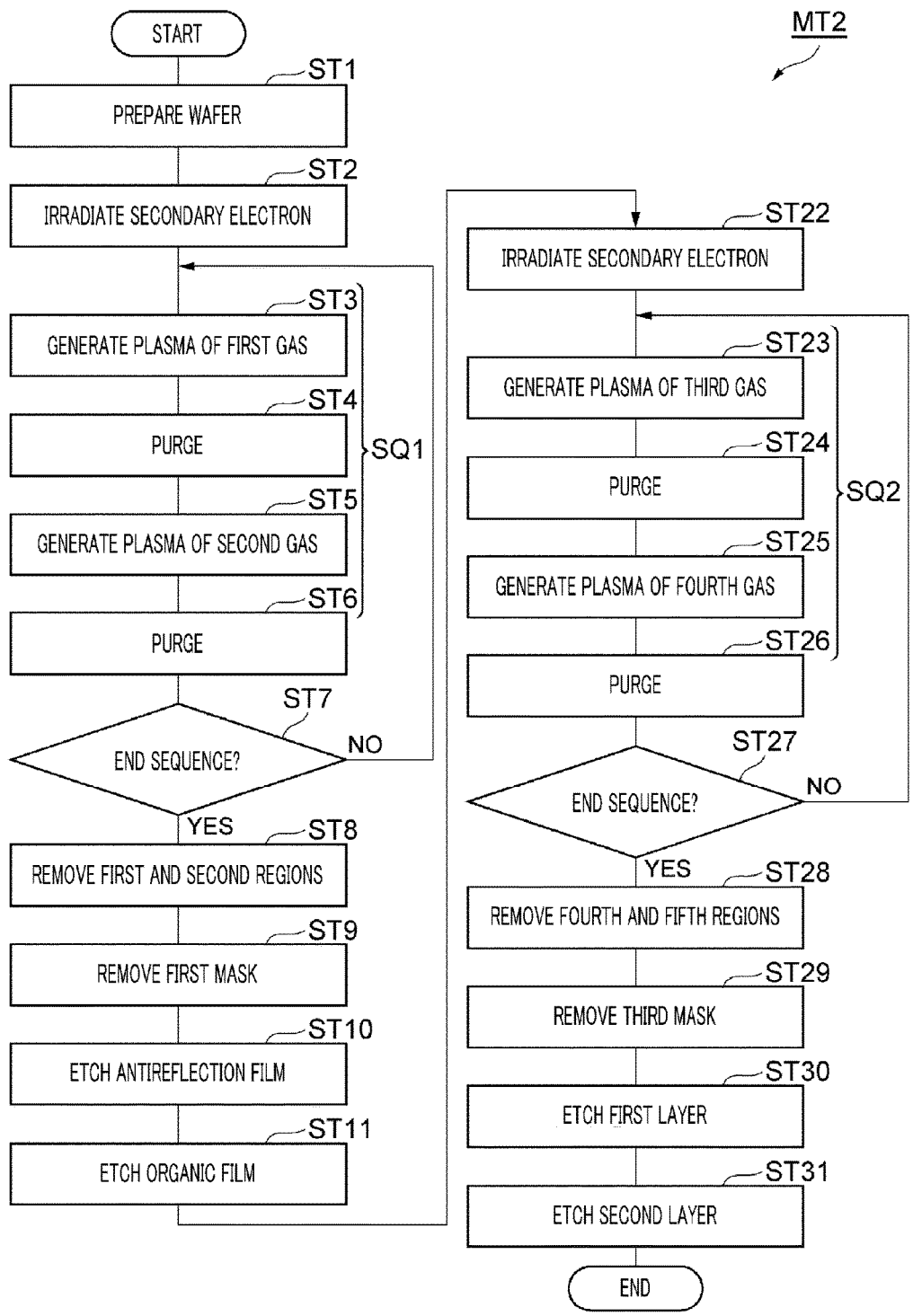

METHOD OF PROCESSING TARGET OBJECT

CROSS-REFERENCE TO RELATED APPLICATION

This application claims the benefit of Japanese Patent Application No. 2014-206602 filed on Oct. 7, 2014, the disclosures of which are incorporated herein by reference.

TECHNICAL FIELD

The embodiments described herein pertain generally to a method of processing a target object, and more particularly, to a method including forming a mask.

BACKGROUND

In a manufacturing process of an electronic device such as a semiconductor device, a mask is formed on an etching target layer and an etching process is performed to transcribe a pattern of the mask onto the etching target layer. As the mask, a resist mask is generally used. The resist mask is formed by photolithography. Therefore, a critical dimension of the pattern formed on the etching target layer is influenced by a resolution limit of the resist mask formed by the photolithography.

However, in recent years, as electronic devices have been highly integrated, it has been demanded to form a pattern having a smaller dimension than the resolution limit of the resist mask. For this reason, as described in Patent Document 1, a multi-patterning method such as a double patterning method or a quadruple patterning method has been used.

In the double patterning method, a silicon oxide film is formed to cover a resist mask serving as a first mask, and in the entire region of the silicon oxide film, only a region along a side wall of the resist mask remains, and then, the resist mask is removed. Thereafter, an organic film is etched using the remaining region made of silicon oxide as a second mask. Thus, a third mask for etching an etching target layer is formed.

In the quadruple patterning method, a silicon oxide film is formed to cover the third mask obtained by the double patterning method, and in the entire region of the silicon oxide film, only a region along a side wall of the third mask remains, and then, the third mask is removed. Thus, a fourth mask for etching an etching target layer is formed.

In the above-described multi-patterning method, a chemical vapor deposition (CVD) method using a silane gas is generally used to form the silicon oxide film.

Patent Document 1: International Publication No. WO2009/101878

In the CVD method, a film thickness of a silicon oxide film formed on a top surface of a mask and on a surface of a layer directly under the mask is increased and a film thickness of a silicon oxide film formed along a side surface of the mask is decreased. Further, it is difficult to control a film thickness of the silicon oxide film formed along the side surface of the mask with a high accuracy. Therefore, in the conventional multi-patterning method, a controllability of a size of a mask, for example, a controllability of a width of the mask and/or a width of an opening of the mask is low. Accordingly, it has been demanded to increase the controllability of the size of the mask in the multi-patterning method.

SUMMARY

In one exemplary embodiment, a method of processing a target object is provided. The target object has an etching target layer; an organic film prepared on the etching target layer; a silicon-containing antireflection film prepared on the organic film; and a first mask formed of a resist material and prepared on the antireflection film. Further, the method includes (a) a process of forming a silicon oxide film on the first mask and the antireflection film within a processing vessel of a plasma processing apparatus in which the target object is accommodated, and the silicon oxide film includes a first region formed on a top surface of the first mask, a second region formed on the antireflection film, and a third region formed on a side surface of the first mask. Further, the method includes (b) a process of forming a second mask based on the third region by removing the first region and the second region with plasma generated within the processing vessel; (c) a process of removing the first mask with plasma generated within the processing vessel; (d) a process of etching the antireflection film with plasma generated within the processing vessel; and (e) a process of forming a third mask formed of organic film region by etching the organic film with plasma generated within the processing vessel. Moreover, in the process of forming the silicon oxide film, the silicon oxide film is formed by performing a sequence including (a1) a first process of generating plasma of a first gas including a silicon halide gas and forming a reaction precursor within the processing vessel accommodating therein the target object; (a2) a second process of purging a space within the processing vessel; (a3) a third process of generating plasma of a second gas including an oxygen gas and forming the silicon oxide film within the processing vessel; and (a4) a fourth process of purging the space within the processing vessel.

The silicon halide gas used in the method according to the present exemplary embodiment, for example, a $SiCl_4$ gas, a $SiBr_4$ gas, a $SiF_4$ gas, or a $SiH_2Cl_4$ gas, is in a vaporized state at room temperature. Therefore, according to the method of the present exemplary embodiment, it is possible to deposit the precursor including silicon on the mask at a low temperature without using a dedicated film forming apparatus provided with a vaporizer.

Further, according to the method of the present exemplary embodiment, the precursor including silicon is deposited on the first mask and the antireflection film during the first process, and after the purge during the second process, a halogen element in the precursor is substituted with oxygen during the subsequent third process. Then, the purge is performed during the fourth process. Further, the purge during the second process and the fourth process is performed for the purpose of substituting the gas within the processing vessel in order to suppress the silicon halide gas and the oxygen gas from being provided within the processing vessel at the same time. Furthermore, the purge may be performed by a gas purge allowing an inert gas to flow into the processing vessel or an evacuation purge. Therefore, in the same manner as an ALD method, a silicon oxide film having a small film thickness can be uniformly formed on the mask by performing the sequence including the first to fourth processes one time. That is, it is possible to conformally form the silicon oxide film having the small film thickness by performing the sequence one time. In this method, since the second mask is formed by using the silicon oxide film, a controllability of a size of the second mask can be improved. Further, a controllability of a size of the third mask formed of the organic film by using the second mask can be also improved. Furthermore, the third mask formed by the method according to the exemplary embodiment can be used to etch the etching target layer or can be used to form a fourth mask for a quadruple patterning method.

In the exemplary embodiment, the above-described sequence may be repeatedly performed. In this exemplary embodiment, a film thickness of a silicon oxide film to be formed can be controlled depending on the number of times of repeating the sequence. Thus, a controllability of a width of the second mask and/or a width of an opening formed by the second mask can be improved.

In the exemplary embodiment, the first process may be performed under a high-pressure and low-power condition in which a pressure within the processing vessel is 13.33 Pa or more and a power from the high frequency power supply for plasma generation is 100 W or less. By generating plasma under the high-pressure and low-power condition, it is possible to suppress active species of halogen elements from excessively generated. Thus, it is possible to suppress damage to the first mask and/or the previously formed silicon oxide film. Further, it is possible to reduce a difference in film thickness of the silicon oxide films at the respective regions on the mask. Furthermore, in the exemplary embodiment, a bias power for ion attraction may not be applied to a placing table configured to support the target object. According to this exemplary embodiment, the uniformity in the film thickness of the silicon oxide films respectively formed on the top surface of the first mask, the surface of the antireflection film, and the side surface of the first mask, i.e., the first region, the second region, and the third region, can be further increased.

In the exemplary embodiment, the plasma processing apparatus may be a capacitively coupled plasma processing apparatus. Further, the method may further include a process of irradiating secondary electrons to the first mask by generating plasma within the processing vessel and applying a negative DC voltage to an upper electrode of the plasma processing apparatus, before performing the process of forming the silicon oxide film. According to this exemplary embodiment, it is possible to modify the first mask and suppress damage to the first mask caused by a subsequent process.

The method according to this exemplary embodiment may further include (f) a process of forming another silicon oxide film on the third mask and the etching target layer within the processing vessel, the another silicon oxide film includes a fourth region formed on a top surface of the third mask, a fifth region formed on the etching target layer, and a sixth region formed on a side surface of the third mask. Further (g) a process of forming a fourth mask based on the sixth region by removing the fourth region and the fifth region with the plasma generated within the processing vessel; and (h) a process of removing the third mask with plasma generated within the processing vessel. Moreover, in the process of forming the another silicon oxide film, the another silicon oxide film is formed by performing a sequence including (f1) a fifth process of generating plasma of a third gas including a silicon halide gas and forming a reaction precursor within the processing vessel accommodating therein the target object; (f2) a sixth process of purging the space within the processing vessel; (f3) a seventh process of generating plasma of a fourth gas including an oxygen gas and forming the another silicon oxide film within the processing vessel; and (f4) an eighth process of purging the space within the processing vessel.

In the method according to this exemplary embodiment, the fourth mask is formed by a quadruple patterning method. The fourth mask is formed based on the sixth region of the silicon oxide film formed by the fifth to eighth processes which are performed in the same manner as the first to fourth processes. Therefore, according to this exemplary embodiment, a controllability of a size of the fourth mask can be improved. Further, in the fifth process, it is possible to deposit the precursor including silicon on the mask at a low temperature without using a dedicated film forming apparatus provided with a vaporizer.

In the exemplary embodiment, the sequence including the fifth to eighth processes may be repeatedly performed. Further, the fifth process may be performed under the high-pressure and low-power condition in which the pressure within the processing vessel is 13.33 Pa or more and the power from the high frequency power supply for plasma generation is 100 W or less. Moreover, in the fifth process, the bias power for ion attraction may not be applied to a placing table configured to support the target object.

In the exemplary embodiment, the plasma processing apparatus may be a capacitively coupled plasma processing apparatus, and the method may further include a process of irradiating secondary electrons to the third mask by generating plasma within the processing vessel and applying a negative DC voltage to an upper electrode of the plasma processing apparatus, before performing the process of forming the another silicon oxide film. According to this exemplary embodiment, it is possible to modify the third mask and suppress damage to the third mask caused by a subsequent process.

As described above, in the multi-patterning method, the controllability of the size of the mask can be improved.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 7 is a flowchart illustrating a method of processing a target object in accordance with another exemplary embodiment;

DETAILED DESCRIPTION

Figure 1:
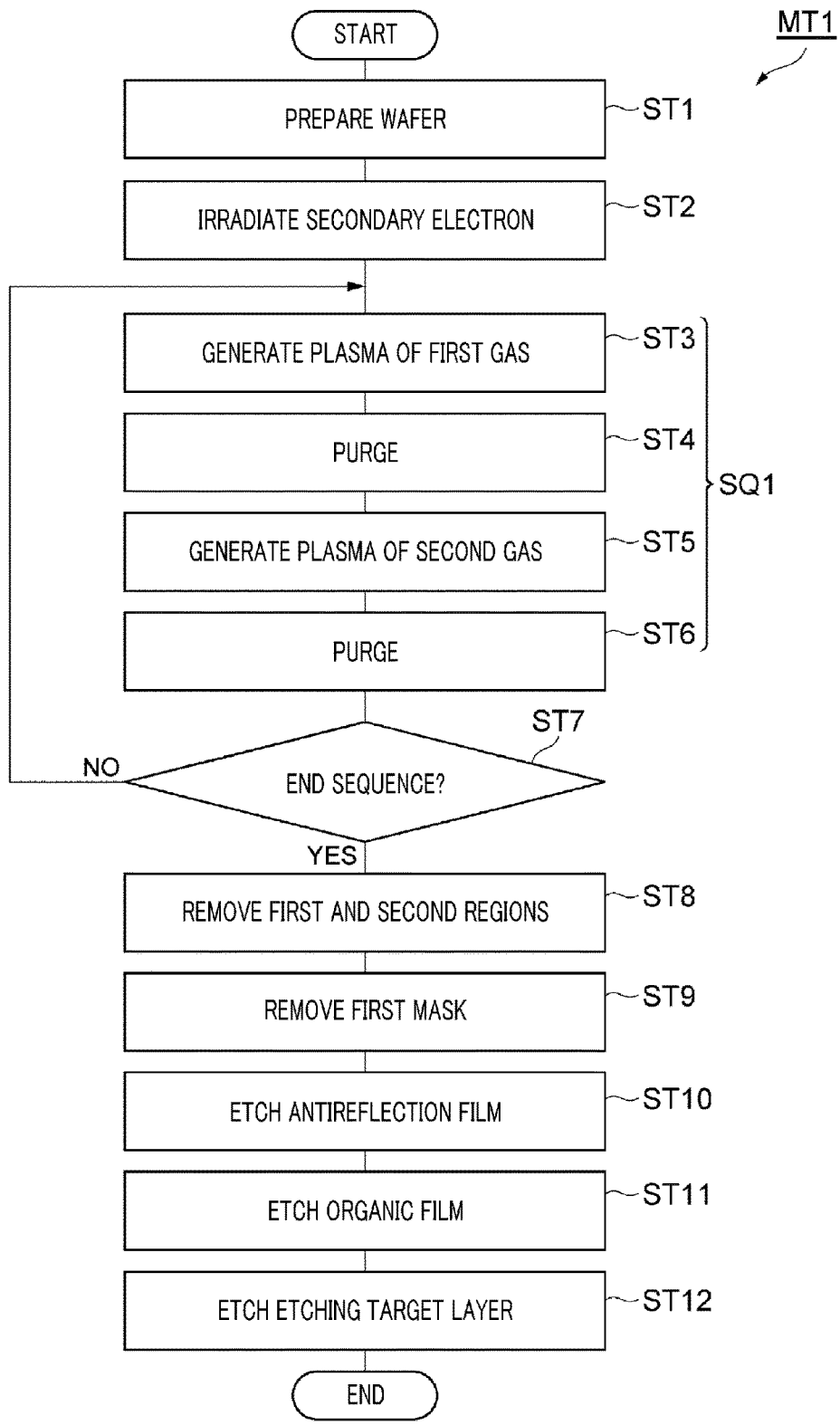
FIG. 1 is a flowchart illustrating a method of processing a target object in accordance with an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

FIG. 1 is a flowchart illustrating a method of processing a target object in accordance with an exemplary embodiment. A method MT1 illustrated in FIG. 1 is to form a mask by a double patterning method. The method MT1 in accordance with the exemplary embodiment is to etch an etching target layer. Further, in the method MT1 in accordance with the exemplary embodiment, a series of processes can be performed by using a single plasma processing apparatus.

Figure 2:
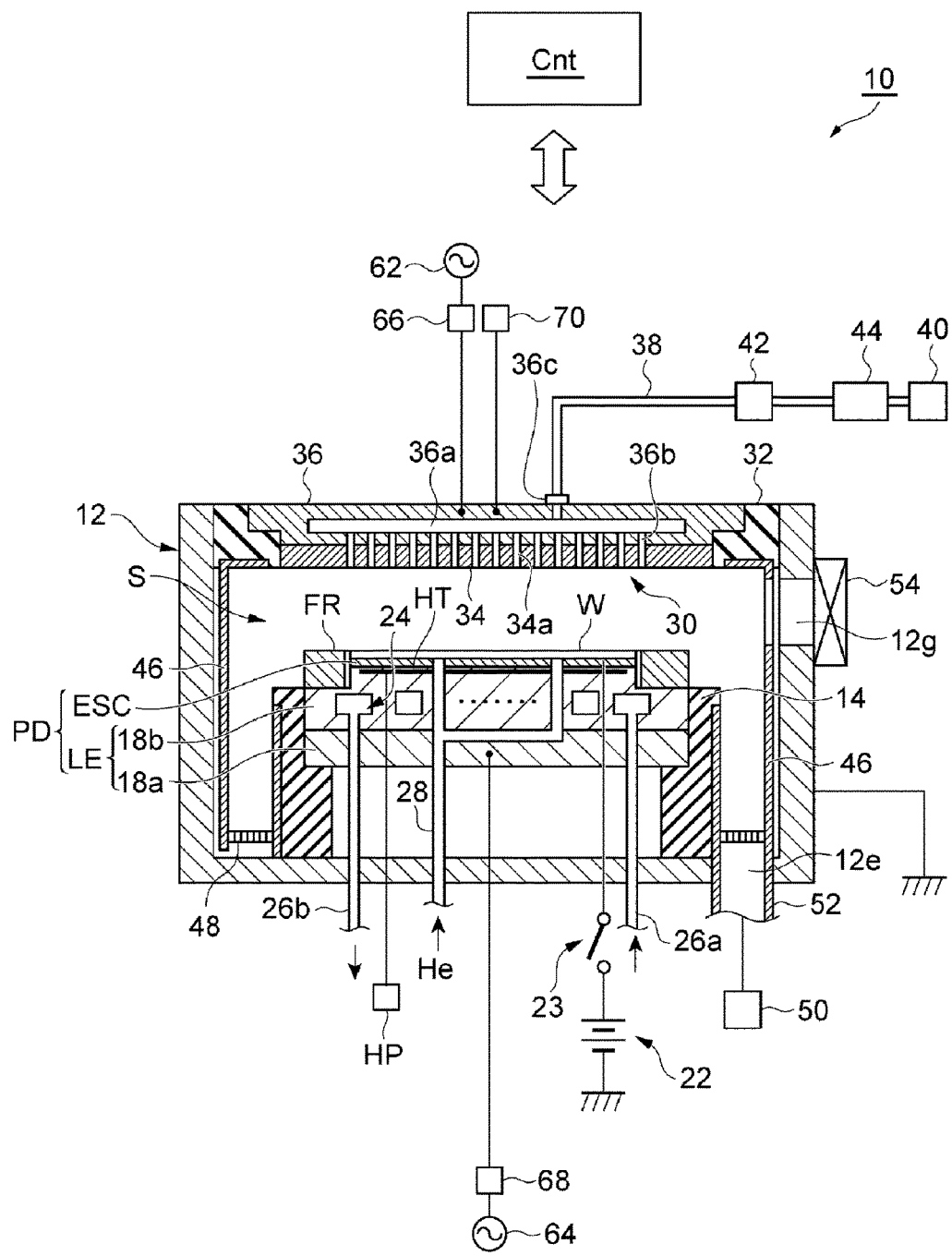
FIG. 2 is a diagram illustrating an example of a plasma processing apparatus.

FIG. 2 is a diagram illustrating an example of a plasma processing apparatus. FIG. 2 schematically illustrates a cross-sectional structure of a plasma processing apparatus 10 which can be used in various exemplary embodiments of a method of processing a target object. As illustrated in FIG. 2, the plasma processing apparatus 10 is a capacitively coupled plasma etching apparatus and includes a processing vessel 12. The processing vessel 12 has a substantially cylindrical shape. The processing vessel 12 is formed of, for example, aluminum and an inner wall surface thereof is anodically oxidized. The processing vessel 12 is frame-grounded.

A substantially cylindrical support 14 is provided on a bottom of the processing vessel 12. The support 14 is formed of, for example, an insulating material. The insulating material constituting the support 14 may include oxygen such as quartz. The support 14 is extended within the processing vessel 12 in a vertical direction from the bottom of the processing vessel 12. Further, a placing table PD is provided within the processing vessel 12. The placing table PD is supported by the support 14.

The placing table PD holds a wafer W on its top surface. The placing table PD includes a lower electrode LE and an electrostatic chuck ESC. The lower electrode LE includes a first plate 18a and a second plate 18b. The first plate 18a and the second plate 18b are formed of metal such as aluminum and has a substantially disc shape. The second plate 18b is provided on the first plate 18a and electrically connected with the first plate 18a.

The electrostatic chuck ESC is provided on the second plate 18b. The electrostatic chuck ESC has a structure in which an electrode formed of a conductive film is interposed between a pair of insulating layers or insulating sheets. The electrode of the electrostatic chuck ESC is electrically connected with a DC power supply 22 via a switch 23. The electrostatic chuck ESC is configured to adsorb the wafer W by an electrostatic force such as a Coulomb force generated by a DC voltage from the DC power supply 22. Thus, the electrostatic chuck ESC can hold the wafer W.

A focus ring FR is placed on a periphery of the second plate 18b to surround an edge of the wafer W and the electrostatic chuck ESC. The focus ring FR is provided to improve etching uniformity. The focus ring FR is formed of a material appropriately selected depending on a material for an etching target film, and may be formed of, for example, quartz.

A coolant path 24 is formed within the second plate 18b. The coolant path 24 constitutes a temperature controller. A coolant is supplied within the coolant path 24 via a line 26a from a chiller unit provided outside of the processing vessel 12. The coolant supplied through the coolant path 24 is returned back to the chiller unit via a line 26b. As such, the coolant is supplied and circulated within the coolant path 24. By controlling a temperature of the coolant, a temperature of the wafer W supported by the electrostatic chuck ESC is controlled.

Further, a gas supply line 28 is provided in the plasma processing apparatus 10. A heat transfer gas, for example, a He gas, is supplied into a gap between a top surface of the electrostatic chuck ESC and a rear surface of the wafer W via a gas supply line 28 from a heat transfer gas supply device.

Further, a heater HT as a heating element is provided in the plasma processing apparatus 10. For example, the heater HT is embedded in the second plate 18b. The heater HT is connected with a heater power supply HP. Since a power is supplied from the heater power supply HP to the heater HT, a temperature of the placing table PD is controlled and a temperature of the wafer W placed on the placing table PD is also controlled. Otherwise, the heater HT may be embedded in the electrostatic chuck ESC.

Furthermore, the plasma processing apparatus 10 includes an upper electrode 30. The upper electrode 30 is provided above the placing table PD to face the placing table PD. The lower electrode LE and the upper electrode 30 are arranged to be substantially parallel to each other. A processing space S in which a plasma process is performed on the wafer W is formed between the upper electrode 30 and the lower electrode LE.

The upper electrode 30 is supported at an upper portion of the processing vessel 12 via an insulating shield member 32. The insulating shield member 32 is formed of an insulating material and may include, for example, oxygen such as quartz. The upper electrode 30 may include an electrode plate 34 and an electrode supporting body 36. The electrode plate 34 faces the processing space S and includes multiple gas discharge holes 34a. In the exemplary embodiment, the electrode plate 34 is formed of silicon.

The electrode supporting body 36 is configured to detachably support the electrode plate 34 and may be formed of a conductive material such as aluminum. The electrode supporting body 36 may have a water-cooling structure. A gas diffusion space 36a is formed within the electrode supporting body 36. Multiple gas through holes 36b communicating with the gas discharge holes 34a are downwardly extended from the gas diffusion space 36a. Further, a gas inlet opening 36c through which a processing gas is introduced into the gas diffusion space 36a is formed at the electrode supporting body 36, and the gas inlet opening 36c is connected with a gas supply line 38.

The gas supply line 38 is connected with a gas source group 40 via a valve group 42 and a flow rate controller group 44. The gas source group 40 includes multiple gas sources. The multiple gas sources may include a source for a silicon halide gas, a source for an oxygen gas, a source for a nitrogen gas, a source for a fluorocarbon gas, and a source for a rare gas. As the silicon halide gas, for example, a $SiCl_4$ gas may be used. Further, as the silicon halide gas, a $SiBr_4$ gas, a $SiF_4$ gas, or a $SiH_2Cl_4$ gas may be used. Furthermore, as the fluorocarbon gas, a certain fluorocarbon gas such as a $CF_4$ gas, a $C_4F_6$ gas, and a $C_4F_8$ gas may be used. Moreover, as the rare gas, a certain rare gas such as a He gas and an Ar gas may be used. In another exemplary embodiment, the multiple gas sources may further include a source for a gas, such as a HBr gas, for etching a polycrystalline silicon layer.

The valve group 42 includes multiple valves, and the flow rate controller group 44 includes multiple flow rate controllers such as mass flow controllers. The multiple gas sources belonging to the gas source group 40 are respectively connected with the gas supply line 38 via the corresponding valves belonging to the valve group 42 and the corresponding flow rate controllers belonging to the flow rate controller group 44. Therefore, the plasma processing apparatus 10 can supply a gas from at least one gas source selected from the multiple gas sources belonging to the gas source group 40 into the processing vessel 12 at a preset flow rate.

Further, in the plasma processing apparatus 10, a deposition shield 46 is detachably provided along an inner wall of the processing vessel 12. The deposition shield 46 is also provided at an outer periphery of the support 14. The deposition shield 46 is configured to suppress an etching byproduct (deposition) from being attached to the processing vessel 12, and may be formed by coating ceramic such as $Y_2O_3$ on an aluminum member. The deposition shield may be formed of a material including oxygen such as quartz besides $Y_2O_3$.

An exhaust plate 48 is provided at a bottom side of the processing vessel 12 and between the support 14 and a side wall of the processing vessel 12. The exhaust plate 48 may be formed by coating ceramic such as $Y_2O_3$ on an aluminum member. An exhaust port 12e is formed under the exhaust plate 48 and in the processing vessel 12. The exhaust port 12e is connected with an exhaust device 50 via an exhaust line 52. The exhaust device 50 includes a vacuum pump such as a turbo molecular pump and depressurizes a space within the processing vessel 12 to a desired vacuum level. Further, a carry-in/out port 12g for the wafer W is formed at the side wall of the processing vessel 12, and the carry-in/out port 12g is opened and closed by a gate valve 54.

Further, the plasma processing apparatus 10 further includes a first high frequency power supply 62 and a second high frequency power supply 64. The first high frequency power supply 62 is configured to generate a first high frequency power for plasma generation of a frequency of 27 MHz to 100 MHz, for example, 40 MHz. The first high frequency power supply 62 is connected with the upper electrode 30 via a matching unit 66. The matching unit 66 is a circuit for matching an output impedance of the first high frequency power supply 62 with an input impedance on a load side (lower electrode LE's side). Otherwise, the first high frequency power supply 62 may be connected with the lower electrode LE via the matching unit 66.

The second high frequency power supply 64 is configured to generate a second high frequency power, i.e., a high frequency bias power, for ion attraction onto the wafer W of a frequency of 400 kHz to 13.56 MHz, for example, 13.56 MHz. The second high frequency power supply 64 is connected with the lower electrode LE via a matching unit 68. The matching unit 68 is a circuit for matching an output impedance of the second high frequency power supply 64 with an input impedance on the load side (lower electrode LE's side).

The plasma processing apparatus 10 further includes a power supply 70. The power supply 70 is connected with the upper electrode 30. The power supply 70 applies, to the upper electrode 30, a voltage for attracting cations in the processing space S toward the electrode plate 34. By way of example, the power supply 70 is a DC power supply configured to generate a negative DC voltage. When such a voltage is applied to the upper electrode 30 from the power supply 70, the cations in the processing space S collide with the electrode plate 34. Thus, secondary electrons are emitted from the electrode plate 34.

Further, in the exemplary embodiment, the plasma processing apparatus 10 may further include a control unit Cnt. The control unit Cnt is a computer including a processor, a storage unit, an input device, a display device, and the like, and controls components of the plasma processing apparatus 10. To be specific, the control unit Cnt is connected with the valve group 42, the flow rate controller group 44, the exhaust device 50, the first high frequency power supply 62, the matching unit 66, the second high frequency power supply 64, the matching unit 68, the power supply 70, the heater power supply HP, and the chiller unit.

The control unit Cnt is operated according to a program based on an input recipe and transmits a control signal. In response to the control signal from the control unit Cnt, selection of a gas supplied from the gas source group and a flow rate thereof, exhaust of the exhaust device 50, power supply from the first high frequency power supply 62 and the second high frequency power supply 64, voltage application from the power supply 70, power supply from the heater power supply HP, and a flow rate and a temperature of the coolant from the chiller unit can be controlled. Further, processes in the method of processing the target object as described in the present disclosure may be performed by operating the respective components of the plasma processing apparatus 10 under the control of the control unit Cnt.

Figure 4A:
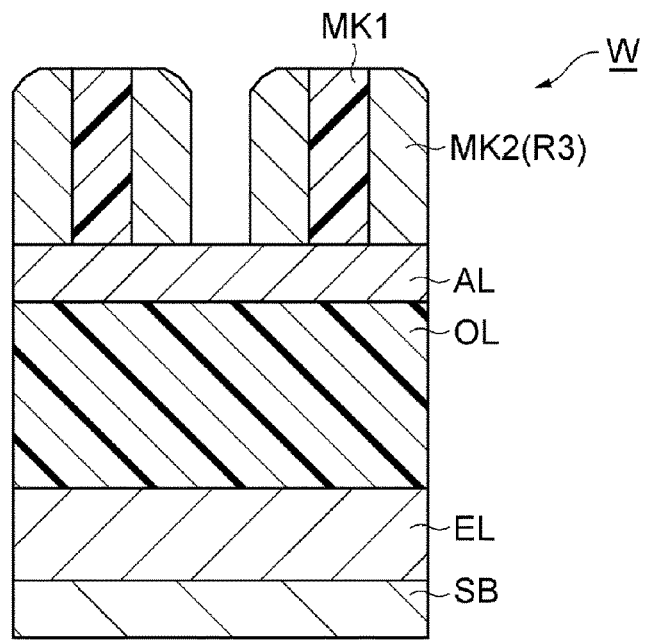
FIG. 4A and FIG. 4B are cross-sectional views each illustrating a status of the target object after performing each process of the method illustrated in FIG. 1.
Figure 4B:
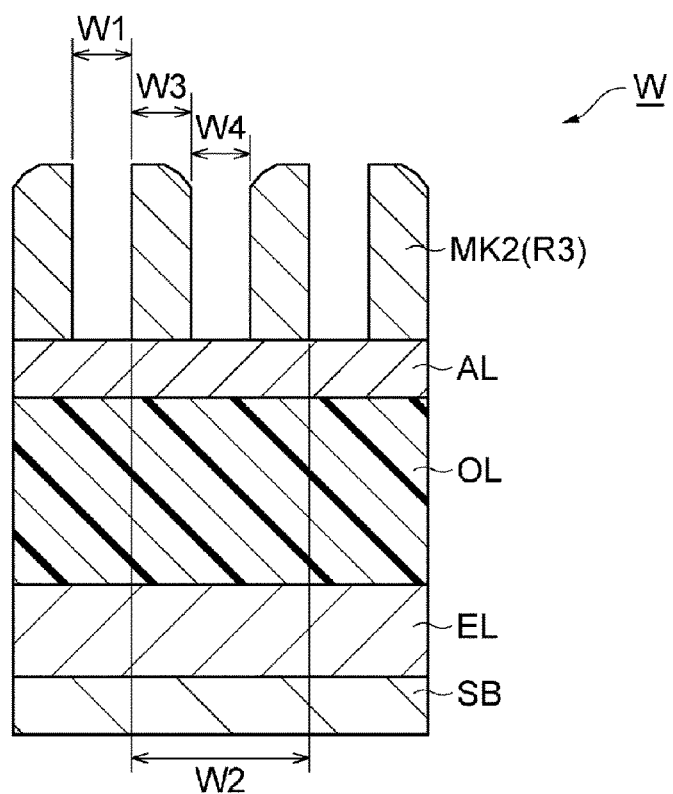
Figure 5A:
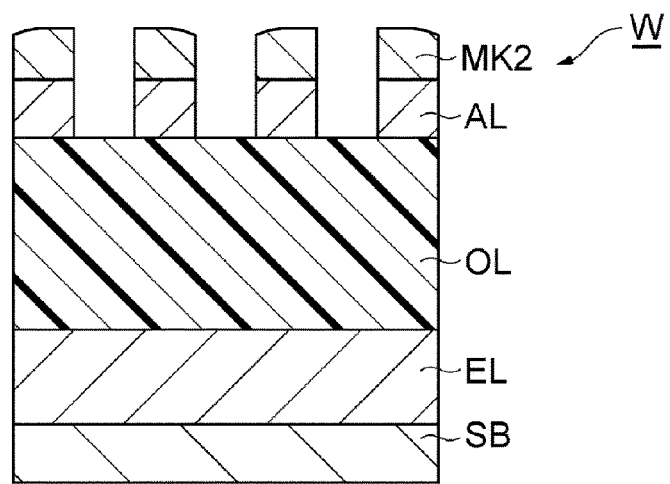
FIG. 5A to FIG. 5C are cross-sectional views each illustrating a status of the target object after performing each process of the method illustrated in FIG. 1.
Figure 5B:
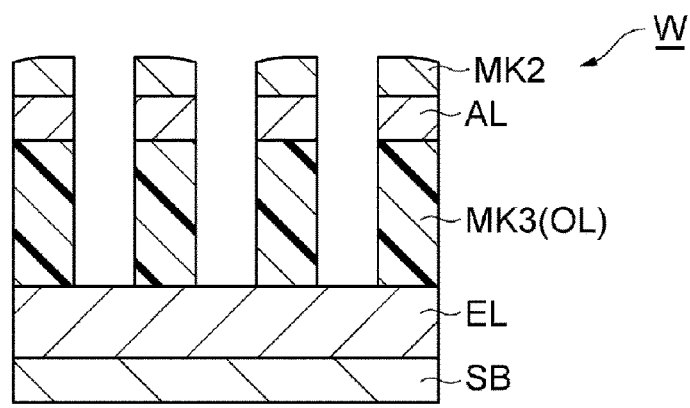
Figure 5C:
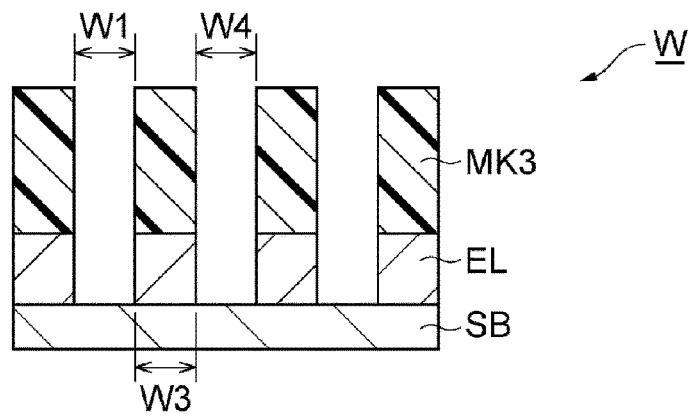
Figure 6A:
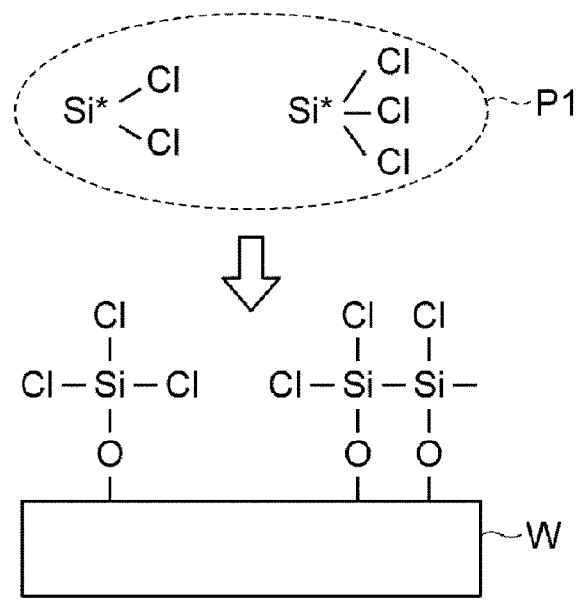
FIG. 6A and FIG. 6B are diagrams explaining a principle of forming a silicon oxide film.
Figure 6B:
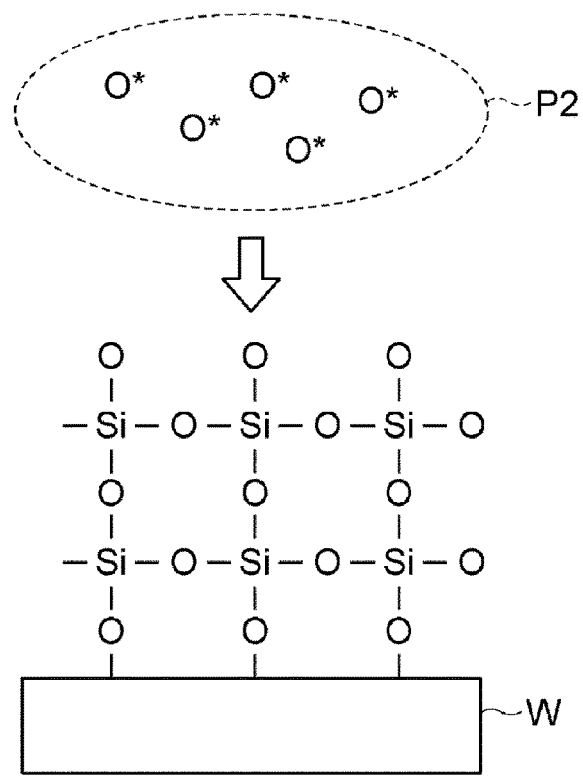

Referring to FIG. 1 again, the method MT1 will be described in detail. Hereinafter, an example in which the method MT1 is performed in the plasma processing apparatus 10 will be described. Further, the following description will refer to FIG. 3A and FIG. 3B, FIG. 4A and FIG. 4B, FIG. 5A to FIG. 5C, and FIG. 6A and FIG. 6B. FIG. 3A and FIG. 3B, FIG. 4A and FIG. 4B, and FIG. 5A to FIG. 5C are cross-sectional views each illustrating a status of a target object after performing each process in the method illustrated in FIG. 1. FIG. 6A and FIG. 6B are diagrams explaining a principle of forming a silicon oxide film.

Figure 3A:
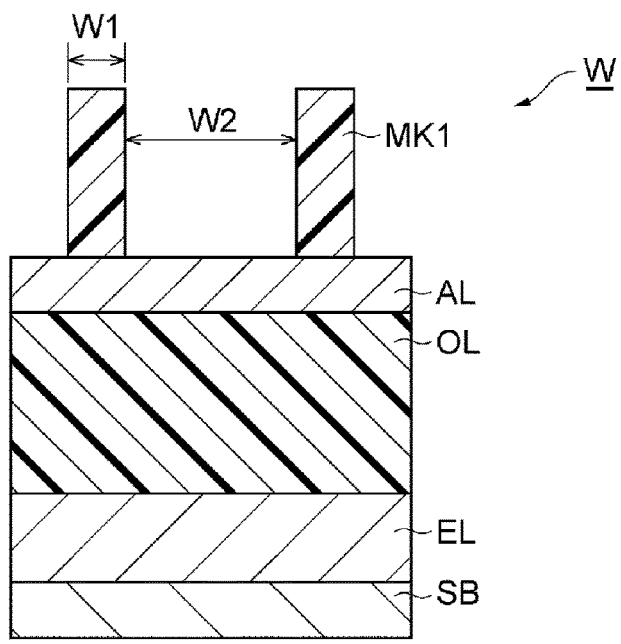
FIG. 3A and FIG. 3B are cross-sectional views each illustrating a status of the target object after performing each process of the method illustrated in FIG. 1.

In the method MT1 illustrated in FIG. 1, a wafer W is prepared in a process ST1. The wafer W prepared in the process ST1 includes a substrate SB, an etching target layer EL, an organic film OL, an antireflection film AL, and a mask MK1 (first mask) as illustrated in FIG. 3A. The etching target layer EL is provided on the substrate SB. The etching target layer EL is formed of a material selectively etched with respect to the organic film OL. By way of example, the etching target layer EL may be formed of silicon oxide ($SiO_2$). Further, the etching target layer EL may be formed of another material such as polycrystalline silicon. The organic film OL is provided on the etching target layer EL. The organic film OL is a layer containing carbon, and may be, for example, a SOH (Spin On Hardmask) layer. The antireflection film AL is a silicon-containing antireflection film and provided on the organic film OL.

The mask MK1 is provided on the antireflection film AL. The mask MK1 is a resist mask formed of a resist material. The mask MK1 is formed by patterning a resist layer by photolithography. The mask MK1 partially covers the antireflection film AL. Further, the mask MK1 includes an opening through which the antireflection film AL is partially exposed. A pattern of the mask MK1 is, for example, a line-and-space pattern.

In the process ST1, the wafer W as illustrated in FIG. 3A is prepared, and the wafer W is carried in the processing vessel 12 of the plasma processing apparatus 10 and placed on the placing table PD.

Then, in the method MT1 according to the exemplary embodiment, a process ST2 is performed. In the process ST2, secondary electrons are irradiated to the wafer W. To be specific, a hydrogen gas and a rare gas are supplied into the processing vessel 12 and the high frequency power is supplied from the first high frequency power supply 62, so that plasma is generated. Further, the power supply 70 applies the negative DC voltage to the upper electrode 30. Thus, the cations in the processing space S are attracted to the upper electrode 30 to collide with the upper electrode 30. Since the cations collide with the upper electrode 30, the secondary electrons are emitted from the upper electrode 30. The emitted secondary electrons are irradiated to the wafer W, so that the mask MK1 is modified. Further, if the negative DC voltage applied to the upper electrode 30 has a large absolute value, silicon as a material of the electrode plate 34 is released together with the secondary electrons when the cations collide with the electrode plate 34. The released silicon is bonded to oxygen released from a component of the plasma processing apparatus 10 exposed to the plasma. The oxygen is released from, for example, the support 14, the insulating shield member 32, and the deposition shield 46. Since the silicon is bonded to the oxygen, a silicon oxide compound is produced, and the silicon oxide compound is deposited on the wafer W to cover and protect the mask MK1. Due to such modification and protection effects, damage to the mask MK1 caused by a subsequent process can be suppressed. Further, in the process ST2, a bias power from the second high frequency power supply 64 needs to be minimized for the modification by irradiating the secondary electrons or for the formation of the protection film.

Then, in the method MT1, a sequence SQ1 is performed one or more times. The sequence SQ1 includes a process ST3, a process ST4, a process ST5, and a process ST6. In the process ST3, plasma of a first gas including a silicon halide gas is generated within the processing vessel 12. To be specific, a silicon halide gas and a rare gas are supplied into the processing vessel 12 from the gas sources selected from the multiple gas sources belonging to the gas source group 40. Further, the high frequency power is supplied from the first high frequency power supply 62. Furthermore, by operating the exhaust device 50, a pressure of a space within the processing vessel 12 is set to a predetermined level. As a result, the plasma of the first gas is generated. The first gas includes, for example, a $SiCl_4$ gas as a silicon halide gas. The first gas may further include the rare gas such as an Ar gas or a He gas. Further, the first gas may include a $SiBr_4$ gas, a $SiF_4$ gas, or a $SiH_2Cl_4$ gas as the silicon halide gas.

As illustrated in FIG. 6A, plasma P1 of the first gas is generated, a reaction precursor such as dissociation species of the silicon halide gas included in the first gas is generated. The generated precursor is attached to the wafer W. Further, FIG. 6A illustrates an example in which a $SiCl_4$ gas is used as the silicon halide gas, and in FIG. 6A, a bonding between Si and Cl in the plasma P1 represents the precursor.

In a subsequent process ST4, the space within the processing vessel 12 is purged. To be specific, the first gas supplied in the process ST3 is exhausted. In the process ST4, as a purge gas, an inert gas such as a nitrogen gas may be supplied into the processing vessel of the plasma processing apparatus. That is, a purge in the process ST4 may be either one of a gas purge performed by supplying an inert gas into the processing vessel or a purge performed by the vacuum evacuation. In the process ST4, a surplus precursor attached onto the wafer W is also removed. Thus, the precursor forms a very thin film on the wafer W.

In a subsequent process ST5, plasma of a second gas including an oxygen gas is generated within the processing vessel 12. To be specific, the second gas including an oxygen gas is supplied into the processing vessel 12 from the gas source selected from the multiple gas sources belonging to the gas source group 40. Further, the high frequency power is supplied from the first high frequency power supply 62. Furthermore, by operating the exhaust device 50, a pressure of the space within the processing vessel 12 is set to a predetermined level.

As described above, the precursor attached to the wafer W by performing the process ST3 includes a bonding between silicon and a halogen element, for example, chlorine. A binding energy between silicon and a halogen element is lower than that between silicon and oxygen. Therefore, as illustrated in FIG. 6B, when the plasma P2 of the second gas is generated and active species of oxygen, for example, oxygen radicals, are generated, the halogen element in the precursor is substituted with oxygen. Thus, a silicon oxide film is formed on the wafer W. Further, in FIG. 6B, "O" represents oxygen.

Returning to FIG. 1, in a subsequent process ST6, the space within the processing vessel 12 is purged. To be specific, the second gas supplied in the process ST5 is exhausted. In the process ST6, as a purge gas, an inert gas such as a nitrogen gas may be supplied into the processing vessel of the plasma processing apparatus. That is, a purge in the process ST6 may be either one of a gas purge performed by supplying an inert gas into the processing vessel or a purge performed by the vacuum evacuation.

During the process ST3 in the sequence SQ1, a silicon halide gas is used as a gas for a precursor. The silicon halide gas, for example, a $SiCl_4$ gas, a $SiBr_4$ gas, a $SiF_4$ gas, or a $SiH_2Cl_4$ gas, is in a vaporized state at room temperature. Therefore, in the process ST3, it is possible to deposit the precursor including silicon on the wafer W at a low temperature without using a dedicated film forming apparatus provided with a vaporizer.

Further, in the sequence SQ1, the purge is performed during the process ST4, and the halogen element in the precursor is substituted with oxygen during the subsequent process ST5. Therefore, in the same manner as an ALD method, a silicon oxide film having a small film thickness can be uniformly formed on the surface of the wafer W by performing the sequence SQ1 one time. That is, it is possible to conformally form a silicon oxide film having a small film thickness by performing the sequence SQ1 one time. Therefore, the method MT1 including the sequence SQ1 has an excellent controllability in adjusting a width of an opening formed by the mask MK1. Further, the method MT1 has an excellent controllability in adjusting a film thickness of a silicon oxide film formed along a side surface of the mask MK1. Furthermore, the method MT1 has an excellent controllability of a size of a mask MK2 formed of the silicon oxide film and a size of a mask MK3 formed of the organic film OL by using the mask MK2, which will be described later.

In the method MT1, in a subsequent process ST7, it is determined whether or not to end the sequence SQ1. To be specific, in the process ST7, it is determined whether or not the number of times of performing the sequence SQ1 reaches a predetermined value. A film thickness of the silicon oxide film formed on the wafer W is determined depending on the number of times of performing the sequence SQ1. That is, actually, the film thickness of the silicon oxide film finally formed on the wafer W is determined by multiplying the number of times of performing the sequence SQ1 by the film thickness of the silicon oxide film formed by performing the sequence SQ1 just one time. Therefore, the number of times of performing the sequence SQ1 is set depending on a desired film thickness of the silicon oxide film formed on the wafer W.

Figure 3B:
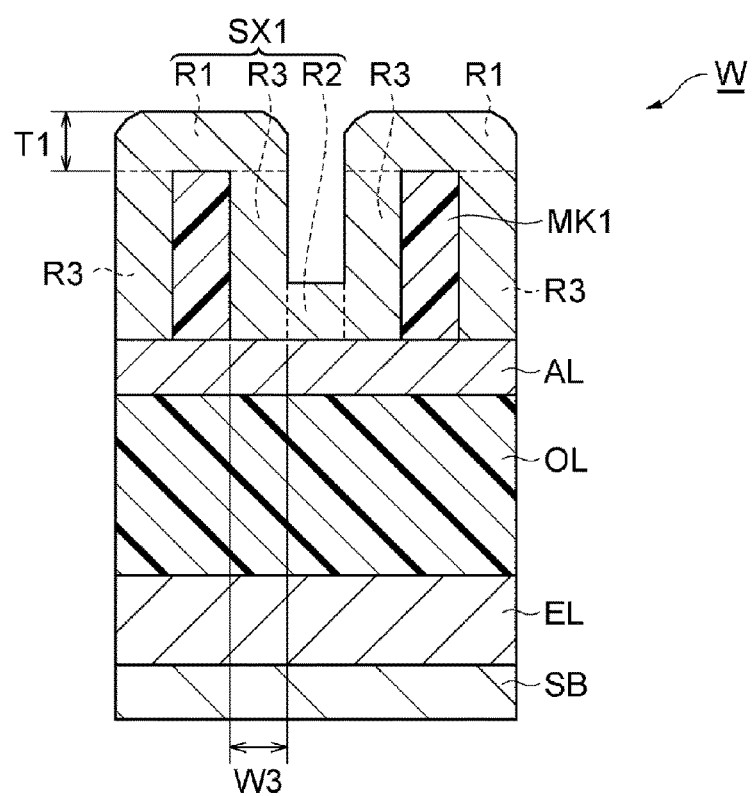

In the method MT1, if it is determined that the number of times of performing the sequence SQ1 does not reach the predetermined value in the process ST7, the sequence SQ1 is repeatedly performed. Meanwhile, if it is determined that the number of times of performing the sequence SQ1 reaches the predetermined value in the process ST7, the sequence SQ1 is stopped. Thus, as shown in FIG. 3B, a silicon oxide film SX1 is formed on the surface of the wafer W. The silicon oxide film SX1 includes a region R1, a region R2, and a region R3. The region R3 is extended on and along the side surface of the mask MK1. The region R3 is extended from a surface of the antireflection film AL to a lower side of the region R1. The region R1 is extended on a top surface of the mask MK1 and on the region R3. Further, the region R2 is extended between the adjacent regions R3 and on the surface of the antireflection film AL. As described above, since the silicon oxide film is formed by performing the sequence SQ1 in the same manner as the ALD method, film thicknesses of the region R1, the region R2, and the region R3 are substantially identical to each other. Further, according to the method MT1, the dense silicon oxide film SX1 having a film density of, for example, 2.28 g/cm$^3$ is obtained.

In the exemplary embodiment, while the process ST3 is performed, a pressure within the processing vessel 12 is set to 13.33 Pa (100 mTorr) or more. Further, while the process ST3 is performed, the high frequency power from the first high frequency power supply 62 is set to 100 W or less. By generating the plasma in such a high-pressure and low-power condition, it is possible to suppress excessive dissociation of the silicon halide gas. That is, it is possible to suppress excessive generation of active species of the halogen element. Further, in order to obtain the same plasma state in which the excessive dissociation is suppressed, the second high frequency power supply 64 may be used. Thus, it is possible to suppress damage to the mask MK1 and/or the previously formed silicon oxide film. Furthermore, it is possible to reduce a difference in the film thickness among the regions R1, R2, and R3.

Further, in the exemplary embodiment, while the process ST3 is performed, most of the high frequency bias power from the second high frequency power supply 64 is not applied to the lower electrode LE. This is because when the bias power is applied, an anisotropic component is generated. By minimizing the bias power as such, it is possible to attach the precursor to the wafer W in an isotropic manner. As a result, the uniformity in the film thickness of the silicon oxide films respectively formed on the top surface and the side surface of the mask MK1, and the surface of the layer directly under the mask MK1 is further improved. Further, if the plasma is generated by using the second high frequency power supply 64, it is necessary to select a condition for minimizing ion energy in order to attach the precursor in the isotropic manner. Furthermore, the process ST5 needs the same isotropic reaction as the above-described process ST3 in order to substitute the precursor attached in the process ST3 with the silicon oxide film. Therefore, even in the process ST5, most of the high frequency bias power from the second high frequency power supply 64 is not applied to the lower electrode LE.

When the above-described sequence SQ1 is ended, a process ST8 of the method MT1 is performed. In the process ST8, the silicon oxide film SX1 is etched to remove the region R1 and the region R2. In order to remove the region R1 and the region R2, a condition for the anisotropic etching is needed. For this reason, in the process ST8, a processing gas including the fluorocarbon gas is supplied into the processing vessel 12 from the gas source selected from the multiple gas sources belonging to the gas source group 40. Further, the high frequency power is supplied from the first high frequency power supply 62, so that plasma is generated. Moreover, the high frequency bias power is supplied from the second high frequency power supply 64. Furthermore, by operating the exhaust device 50, a pressure of the space within the processing vessel 12 is set to a predetermined level. As a result, the plasma of the fluorocarbon gas is generated. Active species containing fluorine in the generated plasma are attracted in a vertical direction by the high frequency bias power to dominantly etch the region R1 and the region R2. Consequently, as illustrated in FIG. 4A, the region R1 and the region R2 are selectively removed. Thus, the mask MK2 (second mask) based on the region R3 is formed.

In a subsequent process ST9, the mask MK1 is removed. To be specific, a processing gas including an oxygen gas is supplied into the processing vessel 12 from the gas source selected from the multiple gas sources belonging to the gas source group 40. Further, the high frequency power is supplied from the first high frequency power supply 62 and the high frequency bias power is supplied from the second high frequency power supply 64. Furthermore, by operating the exhaust device 50, a pressure of the space within the processing vessel 12 is set to a predetermined level. As a result, plasma of the processing gas including an oxygen gas is generated. Oxygen active species in the generated plasma etch the mask MK1 as illustrated in FIG. 4B. Thus, the mask MK1 is removed and the mask MK2 remains on the antireflection film AL.

In a subsequent process ST10, the antireflection film AL is etched. To be specific, a processing gas including the fluorocarbon gas is supplied into the processing vessel 12 from the gas source selected from the multiple gas sources belonging to the gas source group 40. Further, the high frequency power is supplied from the first high frequency power supply 62 and the high frequency bias power is supplied from the second high frequency power supply 64. Furthermore, by operating the exhaust device 50, a pressure of the space within the processing vessel 12 is set to a predetermined level. As a result, plasma of the fluorocarbon gas is generated. Active species containing fluorine in the generated plasma etch a region exposed through the mask MK2 in the entire region of the antireflection film AL as illustrated in FIG. 5A.

In a subsequent process ST11, the organic film OL is etched. To be specific, a processing gas including an oxygen gas is supplied into the processing vessel 12 from the gas source selected from the multiple gas sources belonging to the gas source group 40. Further, the high frequency power is supplied from the first high frequency power supply 62 and the high frequency bias power is supplied from the second high frequency power supply 64. Furthermore, by operating the exhaust device 50, a pressure of the space within the processing vessel 12 is set to a predetermined level. As a result, plasma of the processing gas including an oxygen gas is generated. Oxygen active species in the generated plasma etch a region exposed through the mask MK2 in the entire region of the organic film OL. Thus, as illustrated in FIG. 5B, the mask MK3 (third mask) based on the organic film OL is formed. Further, as a gas for etching the organic film OL, a processing gas including a nitrogen gas and a hydrogen gas may be used.

In a subsequent process ST12, the etching target layer EL is etched. To be specific, a processing gas is supplied into the processing vessel 12 from the gas source selected from the multiple gas sources belonging to the gas source group 40. The processing gas may be appropriately selected depending on the material of the etching target layer EL. By way of example, if the etching target layer EL is formed of silicon oxide, the processing gas may include the fluorocarbon gas. Further, the high frequency power is supplied from the first high frequency power supply 62 and the high frequency bias power is supplied from the second high frequency power supply 64. Furthermore, by operating the exhaust device 50, a pressure of the space within the processing vessel 12 is set to a predetermined level. As a result, plasma is generated. Active species in the generated plasma etch a region exposed through the mask MK3 in the entire region of the etching target layer EL. Thus, a pattern of the mask MK3 is transcribed onto the etching target layer EL as illustrated in FIG. 5C. According to the method MT1, the process ST2 to the process ST12, i.e., all the entire processes from forming the mask based on the resist mask to etching the etching target layer, can be performed by using the single plasma processing apparatus 10.

In the method MT1, a width W1 (see FIG. 4B) of the opening formed by the mask MK2 at a region where the mask MK1 was provided is substantially identical to a width (see FIG. 3A) of the mask MK1. Further, a width W4 (see FIG. 4B) of the opening formed by the mask MK2 at a region where the opening was formed by the mask MK1 has a relationship specified by the following equation (1).

$$W4=W2-2\times W3 \quad (1)$$

Herein, W2 is a width (see FIG. 3A) of the opening formed by the mask MK1, and W3 is the film thickness (see FIG. 3B) of the region R3, i.e., a width (see FIG. 4B) of the mask MK2 in a horizontal direction. As can be seen from the above equation (1), the width W4 can be adjusted depending on the film thickness of the region R3, and the film thickness of the region R3 can be selectively adjusted depending on the number of times of performing the sequence SQ1. That is, the width W3 of the mask MK2 can be selectively adjusted depending on the number of times of performing the sequence SQ1. Therefore, according to the method MT1, it is possible to selectively adjust the width W4. By way of example, according to the method MT1, the widths of all openings formed by the mask MK2 can be substantially identical to each other. By way of example, according to the method MT1, it is possible to form the mask MK2 having a line-and-space pattern in which widths of all spaces are substantially identical to each other. Further, by adjusting the width of the mask MK1 and the width of the opening formed by the mask MK1 and also adjusting the film thickness of the region R3 depending on the number of times of performing the sequence SQ1, it is possible to form the mask MK2 having a preset value of the mask width and a preset value of the opening width. As such, according to the method MT1, it is possible to increase the controllability of the size of the mask MK2. Further, according to the method MT1, since the pattern of the mask MK2 is transcribed onto the organic film OL, the controllability of the size of the mask MK3 based on the organic film OL can be increased in the same manner as the mask MK2.

Hereinafter, there will be described a method of processing a target object in accordance with another exemplary embodiment. FIG. 7 is a flowchart illustrating a method of processing a target object in accordance with another exemplary embodiment. A method MT2 illustrated in FIG. 7 is to form a mask by a quadruple patterning method. Hereinafter, there will be described an example in which the method MT2 illustrated in FIG. 7 is performed in the plasma processing apparatus 10. Further, the following description will refer to FIG. 8A to FIG. 8C and FIG. 9A to FIG. 9C. FIG. 8A to FIG. 8C and FIG. 9A to FIG. 9C are cross-sectional views each illustrating a status of a target object after performing each process in the method illustrated in FIG. 7.

Figure 8A:
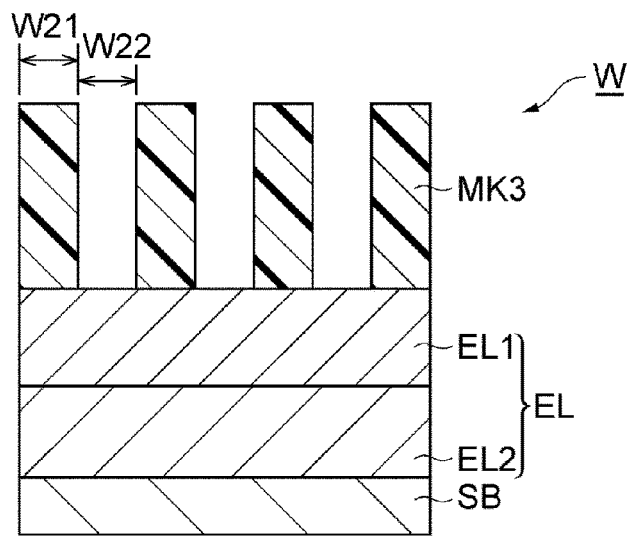
FIG. 8A to FIG. 8C are cross-sectional views each illustrating a status of the target object after performing each process of the method illustrated in FIG. 7.

In the method MT2, the process ST1, the process ST2, the sequence SQ1, and the process ST7 to the process ST11 are performed on the wafer W in the same manner as the method MT1. Thus, the wafer W has a structure as illustrated in FIG. 5B. Then, the mask MK2 and the antireflection film AL may be removed. The mask MK2 and the antireflection film AL may be removed by exposing the wafer W to plasma of a processing gas including the fluorocarbon gas in the plasma processing apparatus 10. Thus, the wafer W is in a status as illustrated in FIG. 8A. In the wafer W according to this exemplary embodiment, as illustrated in FIG. 8A, the etching target layer EL includes a first layer EL1 and a second layer EL2. The second layer EL2 is provided on the substrate SB. The first layer EL1 is provided on the second layer EL2. The first layer EL1 is formed of a material which can be selectively etched with respect to the second layer EL2, and the second layer EL2 is formed of a material which can be selectively etched with respect to the first layer EL1. By way of example, the first layer EL1 may be formed of polycrystalline silicon and the second layer EL2 may be formed of silicon oxide.

In the method MT2, during a subsequent process ST22, secondary electrons are irradiated to the wafer W. The process ST22 is the same process as the process ST2. By performing the process ST22, the mask MK3 is modified. Further, if the negative DC voltage applied to the upper electrode 30 has a large absolute value, as described with reference to the process ST2, silicon released from the electrode plate 34 by the sputtering of the electrode plate 34 is bonded with oxygen released from a component of the plasma processing apparatus 10 exposed to the plasma, so that a silicon oxide compound is produced. The silicon oxide compound may be deposited on the wafer W to protect the mask MK3. Due to such modification of the mask and/or formation of the protective film, damage to the mask MK3 caused by a subsequent process can be suppressed.

Then, a sequence SQ2 is performed one or more times in the same manner as the sequence SQ1. The sequence SQ2 includes a process ST23, a process ST24, a process ST25, and a process ST26. The process ST23, the process ST24, the process ST25, and the process ST26 are the same processes as the process ST3, the process ST4, the process ST5, and the process ST6, respectively.

In a subsequent process ST27, it is determined whether or not to end the sequence SQ2. To be specific, in the process ST27, it is determined whether or not the number of times of performing the sequence SQ2 reaches a predetermined value. A film thickness of the silicon oxide film formed on the wafer W is determined depending on the number of times of performing the sequence SQ2. That is, actually, the film thickness of the silicon oxide film finally formed on the wafer W is determined by multiplying the number of times of performing the sequence SQ2 by the film thickness of the silicon oxide film formed by performing the sequence SQ2 just one time. Therefore, the number of times of performing the sequence SQ2 is set depending on a desired film thickness of the silicon oxide film formed on the wafer W.

Figure 8B:
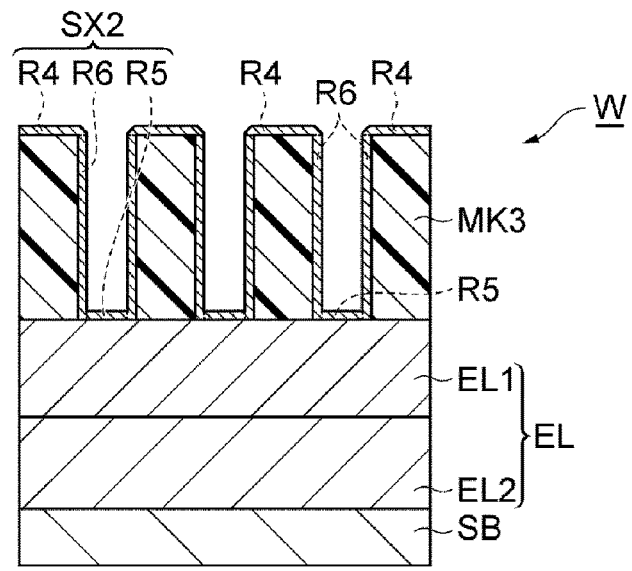

In the method MT2, if it is determined that the number of times of performing the sequence SQ2 does not reach the predetermined value in the process ST27, the sequence SQ2 is repeatedly performed. Meanwhile, if it is determined that the number of times of performing the sequence SQ2 reaches the predetermined value in the process ST27, the sequence SQ2 is stopped. Thus, as shown in FIG. 8B, a silicon oxide film SX2 is formed on the surface of the wafer W. The silicon oxide film SX2 includes a region R4, a region R5, and a region R6. The region R6 is extended on and along the side surface of the mask MK3. The region R6 is extended from a surface of the etching target layer EL to a lower side of the region R4. The region R4 is extended on a top surface of the mask MK3 and on the region R6. Further, the region R5 is extended between the adjacent regions R6 and on the surface of the etching target layer EL. Like the sequence SQ1, the silicon oxide film is formed by performing the sequence SQ2 in the same manner as the ALD method, film thicknesses of the region R4, the region R5, and the region R6 are substantially identical to each other.

In the present exemplary embodiment, in the same manner as the process ST3, while the process ST23 is performed, a pressure within the processing vessel 12 is set to 13.33 Pa (100 mTorr) or more. Further, while the process ST23 is performed, the high frequency power from the first high frequency power supply 62 is set to 100 W or less. By generating the plasma in such a high-pressure and low-power condition, it is possible to suppress excessive dissociation of the silicon halide gas. That is, it is possible to suppress excessive generation of active species of the halogen element. Further, in order to obtain the same plasma state in which the excessive dissociation is suppressed, the second high frequency power supply 64 may be used. Thus, it is possible to suppress damage to the mask MK3 and/or the previously formed silicon oxide film. Furthermore, it is possible to reduce a difference in the film thickness among the regions R4, R5, and R6.

Further, in the present exemplary embodiment, while the process ST23 is performed, most of the high frequency bias power from the second high frequency power supply 64 is not applied to the lower electrode LE. This is because when the bias power is applied, an anisotropic component is generated. By minimizing the bias power as such, it is possible to attach the precursor to the wafer W in an isotropic manner. As a result, the uniformity in the film thickness of the silicon oxide films respectively formed on the top surface and the side surface of the mask MK3, and the surface of the layer directly under the mask MK3 is further improved. Further, if the plasma is generated by using the second high frequency power supply 64, it is necessary to select a condition for minimizing ion energy in order to attach the precursor in the isotropic manner. Furthermore, the process ST25 needs the same isotropic reaction as the above-described process ST23 in order to substitute the precursor attached in the process ST23 with the silicon oxide film. Therefore, even in the process ST25, most of the high frequency bias power from the second high frequency power supply 64 is not applied to the lower electrode LE.

Figure 8C:
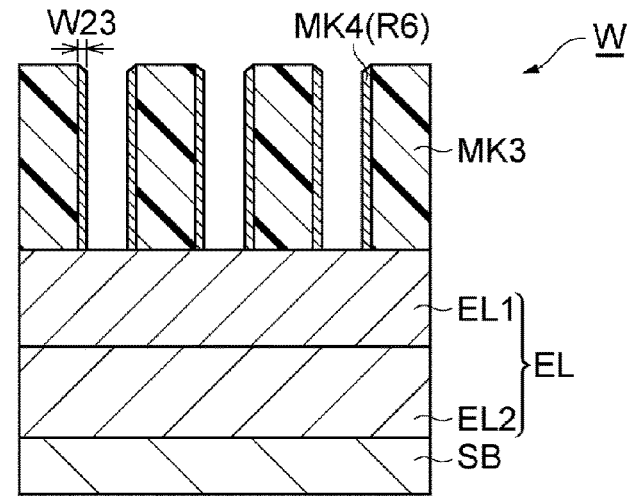

When the above-described sequence SQ2 is ended, a process ST28 of the method MT2 is performed. In the process ST28, the silicon oxide film SX2 is etched to remove the region R4 and the region R5. To be specific, a processing gas including the fluorocarbon gas is supplied into the processing vessel 12 from the gas source selected from the multiple gas sources belonging to the gas source group 40. Further, the high frequency power is supplied from the first high frequency power supply 62. Moreover, the high frequency bias power is supplied from the second high frequency power supply 64. Furthermore, by operating the exhaust device 50, a pressure of the space within the processing vessel 12 is set to a predetermined level. As a result, the plasma of the fluorocarbon gas is generated. Active species containing fluorine in the generated plasma are attracted in a vertical direction by the high frequency bias power to dominantly etch the region R4 and the region R5. Consequently, as illustrated in FIG. 8C, the region R4 and the region R5 are selectively removed. Thus, the mask MK4 (fourth mask) based on the region R6 is formed.

Figure 9A:
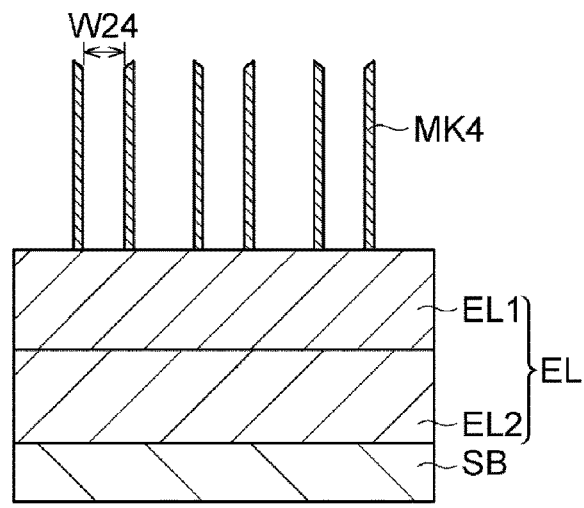
FIG. 9A to FIG. 9C are cross-sectional views each illustrating a status of the target object after performing each process of the method illustrated in FIG. 7.

In a subsequent process ST29, the mask MK3 is removed. To be specific, a processing gas including an oxygen gas is supplied into the processing vessel 12 from the gas source selected from the multiple gas sources belonging to the gas source group 40. Further, the high frequency power is supplied from the first high frequency power supply 62 and the high frequency bias power is supplied from the second high frequency power supply 64. Furthermore, by operating the exhaust device 50, a pressure of the space within the processing vessel 12 is set to a predetermined level. As a result, plasma of the processing gas including an oxygen gas is generated. Oxygen active species in the generated plasma etch the mask MK3 as illustrated in FIG. 9A. Thus, the mask MK3 is removed and the mask MK4 remains on the etching target layer EL.

Then, in the method MT2, the etching target layer EL is etched. In a case where the etching target layer EL includes the first layer EL1 formed of polycrystalline silicon and the second layer EL2 formed of silicon oxide, the first layer EL1 is etched in a process ST30, and then, the second layer EL2 is etched in a process ST31.

Figure 9B:
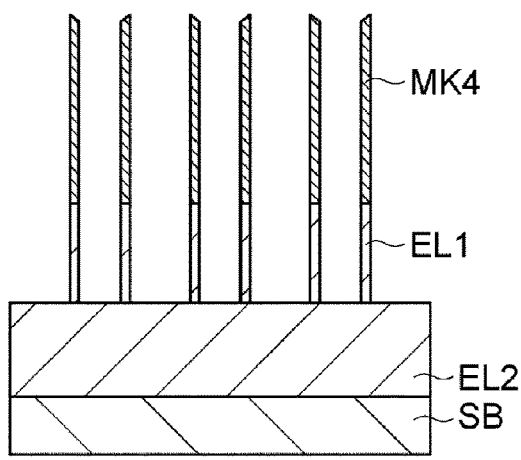

To be specific, a processing gas including a halogen gas, for example, a $Cl_2$ gas, for etching the polycrystalline silicon is supplied into the processing vessel 12 from the gas source selected from the multiple gas sources belonging to the gas source group 40. Further, the high frequency power is supplied from the first high frequency power supply 62 and the high frequency bias power is supplied from the second high frequency power supply 64. Furthermore, by operating the exhaust device 50, a pressure of the space within the processing vessel 12 is set to a predetermined level. As a result, plasma is generated. Active species in the generated plasma etch a region exposed through the mask MK4 in the entire region of the first layer EL1 as illustrated in FIG. 9B. As a result, a pattern of the mask MK4 is transcribed onto the first layer EL1.

Figure 9C:
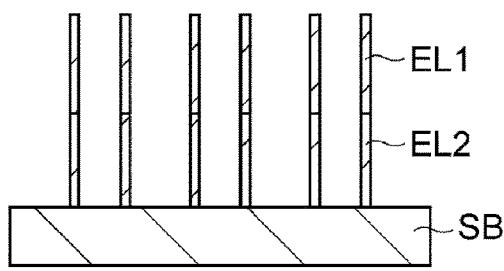

In the subsequent process ST31, a processing gas including the fluorocarbon gas is supplied into the processing vessel 12 from the gas source selected from the multiple gas sources belonging to the gas source group 40. Further, the high frequency power is supplied from the first high frequency power supply 62 and the high frequency bias power is supplied from the second high frequency power supply 64. Furthermore, by operating the exhaust device 50, a pressure of the space within the processing vessel 12 is set to a predetermined level. As a result, plasma is generated. Active species including fluorine in the generated plasma etch a region exposed through the mask MK4 in the entire region of the second layer EL2. Consequently, as illustrated in FIG. 9C, a pattern of the first layer EL1 reflecting the pattern of the mask MK4 is transcribed onto the second layer EL2. According to the method MT2, the process ST2 to the process ST31, i.e., all the entire processes from forming the mask based on the resist mask to etching the etching target layer, can be performed by using the single plasma processing apparatus 10.

Further, according to the method MT2, a film thickness of the region R6, i.e., a width of the mask MK4, can be selectively adjusted depending on the number of times of performing the sequence SQ2. Therefore, a width of the opening formed by the mask MK4 can also be selectively adjusted. By way of example, if a width W21 (see FIG. 8A) of the mask MK3, a width W22 (see FIG. 8B) of the opening formed by the mask MK3, a width W23 (see FIG. 8C) of the mask MK4, and a width W24 (see FIG. 9A) of the opening formed by the mask MK4 at a region where the opening was formed by the mask MK3 are set to satisfy the following equation (2), the widths of all openings formed by the mask MK4 are identical to each other.

$$W21=W22-2\times W23=W24 \quad (2)$$

Herein, in the method MT2, since the width W23 corresponds to the film thickness of the region R6, it can be set depending on the number of times of performing the sequence SQ2. Therefore, according to the method MT2, it is possible to easily satisfy the above equation (2). As such, the method MT2 has the excellent controllability of the size of the mask MK4.

Further, since the width W21 of the mask MK3 reflects the width W3 of the mask MK2, it is possible to obtain the following equation (3) from the equation (2).

$$W3=W21=W22-2\times W23 \quad (3)$$

As can be seen from the equation (3), in order to set the widths of all openings formed by the mask MK4 to be identical to each other, the width W23 of the mask MK4 needs to be smaller than the width of the mask MK2. As such, in the quadruple patterning method, the width of the mask MK2 and the width of the mask MK4, i.e., the film thickness of the silicon oxide film SX1 and the film thickness of the silicon oxide film SX2, may be different from each other due to a design of a mask to be formed. According to the method MT2, the film thickness of the silicon oxide film SX1 can be adjusted depending on the number of times of performing the sequence SQ1 and the film thickness of the silicon oxide film SX2 can be adjusted depending on the number of times of performing the sequence SQ2. Therefore, it is possible to control the film thickness depending on the design of the mask formed by the quadruple patterning method.

Although various exemplary embodiments have been described above, various modifications can be made without being limited to the above-described exemplary embodiments. By way of example, in the above-described exemplary embodiments, the capacitively coupled plasma processing apparatus 10 is used. However, if the process of emitting the secondary electrons from the upper electrode can be omitted from each of the method MT1 and the method MT2, any plasma processing apparatus including a certain plasma source can be used. As the plasma processing apparatus, by way of example, an inductively coupled plasma processing apparatus and a plasma processing apparatus using a surface wave such as a microwave may be used.

Hereinafter, experiments conducted to evaluate the above-described sequence for forming the silicon oxide film will be described.

Experimental Examples 1 to 3

In the experimental examples 1 to 3, the process ST2 and the sequence SQ1 are performed on the wafer illustrated in FIG. 3A by using the plasma processing apparatus 10. Further, in the experimental examples 1 to 3, a pressure within the processing vessel 12 and a high frequency power from the first high frequency power supply 62 during the process ST3 are varied as parameters. To be specific, in the experimental example 1, a pressure within the processing vessel 12 and a high frequency power from the first high frequency power supply 62 during the process ST3 are set to 20 mTorr (2.666 Pa) and 500 W, respectively; in the experimental example 2, a pressure within the processing vessel 12 and a high frequency power from the first high frequency power supply 62 during the process ST3 are set to 200 mTorr (26.66 Pa) and 500 W, respectively; and in the experimental example 3, a pressure within the processing vessel 12 and a high frequency power from the first high frequency power supply 62 during the process ST3 are set to 200 mTorr (26.66 Pa) and 100 W, respectively. Other conditions for the process ST2 and the sequence SQ1 performed in the experimental examples 1 to 3 are described as follows. Further, the number of times of performing the sequence SQ1 is 72.

Figure 10:
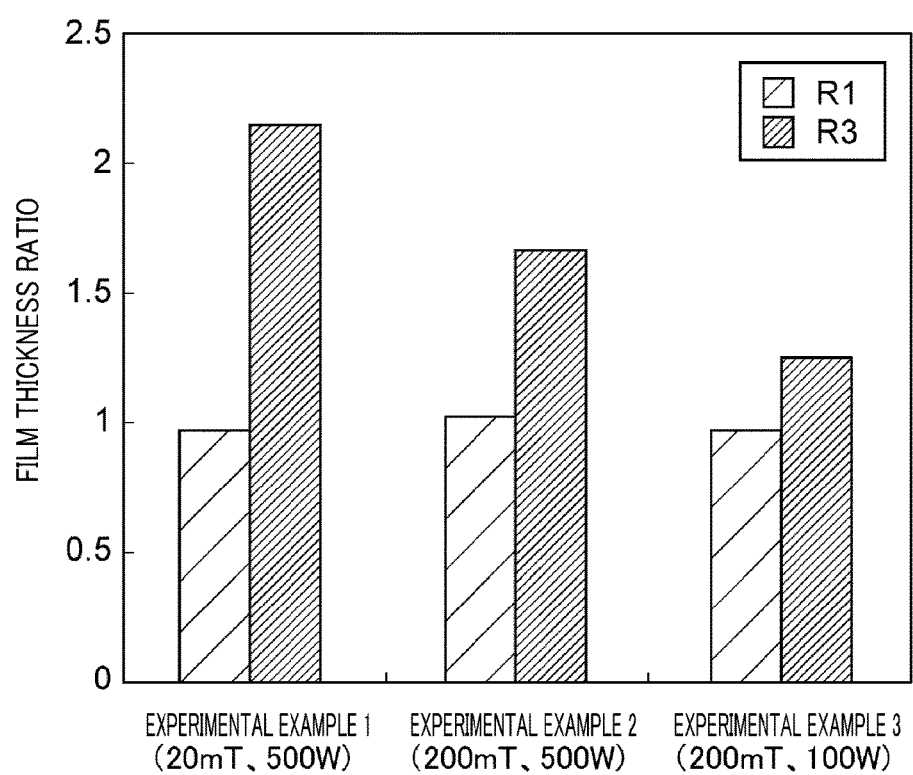
FIG. 10 is a graph illustrating results of experiments.

<Conditions for Process ST2>
Pressure within the processing vessel: 50 mTorr (6.66 Pa)
Hydrogen gas flow rate: 100 sccm
Ar gas flow rate: 800 sccm
High frequency power (supplied to the upper electrode 30) from the first high frequency power supply 62: 60 MHz, 300 W
High frequency bias power from the second high frequency power supply 64: 13 MHz, 0 W
Voltage applied from the power supply 70: −1000V
Processing time: 60 seconds
<Conditions for Process ST3>
Pressure in the processing vessel: 200 mTorr (026.66 Pa)
SiCl$_4$ gas flow rate: 20 sccm
Ar gas flow rate: 200 sccm
High frequency power (supplied to the upper electrode 30) from the first high frequency power supply 62: 60 MHz, 100 W
High frequency bias power from the second high frequency power supply 64: 13 MHz, 0 W
Processing time: 5 seconds
<Conditions for Process ST5>
Pressure in the processing vessel: 200 mTorr (26.66 Pa)
Oxygen gas flow rate: 200 sccm
Ar gas flow rate: 200 sccm High frequency power (supplied to the upper electrode 30) from the first high frequency power supply 62: 60 MHz, 500 W High frequency bias power from the second high frequency power supply 64: 13 MHz, 0 W Processing time: 5 seconds Further, the film thickness (the film thickness T1 of the region R1 illustrated in FIG. 3B) of the silicon oxide film formed on the top surface of the mask MK1 and the film thickness (the film thickness W3 of the region R3 illustrated in FIG. 3B) of the silicon oxide film formed on the side surface of the mask MK1 are measured at a region (hereinafter, referred to as a "sparse region") in which the line patterns of the mask MK1 are sparsely formed and a region (hereinafter, referred to as "dense region") in which the line patterns of the mask MK1 are densely formed. Furthermore, film thickness ratios, i.e., a ratio of the film thickness of the region R1 in the sparse region with respect to the film thickness of the region R1 in the dense region and a ratio of the film thickness of the region R3 in the sparse region with respect to the film thickness of the region R3 in the dense region, are obtained. Results thereof are shown in FIG. 10. Further, in FIG. 10, a legend "R1" represents the film thickness ratio obtained from the film thicknesses of the region R1, and a legend "R3" represents the film thickness ratio obtained from the film thicknesses of the region R3.

As shown in FIG. 10, as the high frequency power from the first high frequency power supply 62 is decreased, the film thickness ratio becomes closer to 1. That is, a difference in the film thickness between the silicon oxide films formed on the dense region and the sparse region is decreased. To be more specific, the film thickness ratio is closer to 1 in the case where the high frequency power from the first high frequency power supply 62 is 100 W than in the case where the high frequency power from the first high frequency power supply 62 is 500 W. Therefore, it is confirmed that it is possible to reduce a difference between the film thickness of the silicon oxide film formed on the dense region and the film thickness of the silicon oxide film formed on the sparse region by setting the high frequency power from the first high frequency power supply 62 to 100 W. Further, as shown in FIG. 10, it is confirmed that a difference between the film thickness ratio in the region R1 and the film thickness ratio in the region R3 is decreased by performing the process ST3 at a high pressure within the processing vessel 12, i.e., in a high-pressure condition. That is, it is confirmed that a difference between the film thickness T1 of the region R1 and the film thickness W3 of the region R3 is decreased by performing the process ST3 in the high-pressure condition. Therefore, it is confirmed that the silicon oxide film can be conformally formed according to the above-described sequence SQ1 and sequence SQ2.

Experimental Example 4

Figure 11:
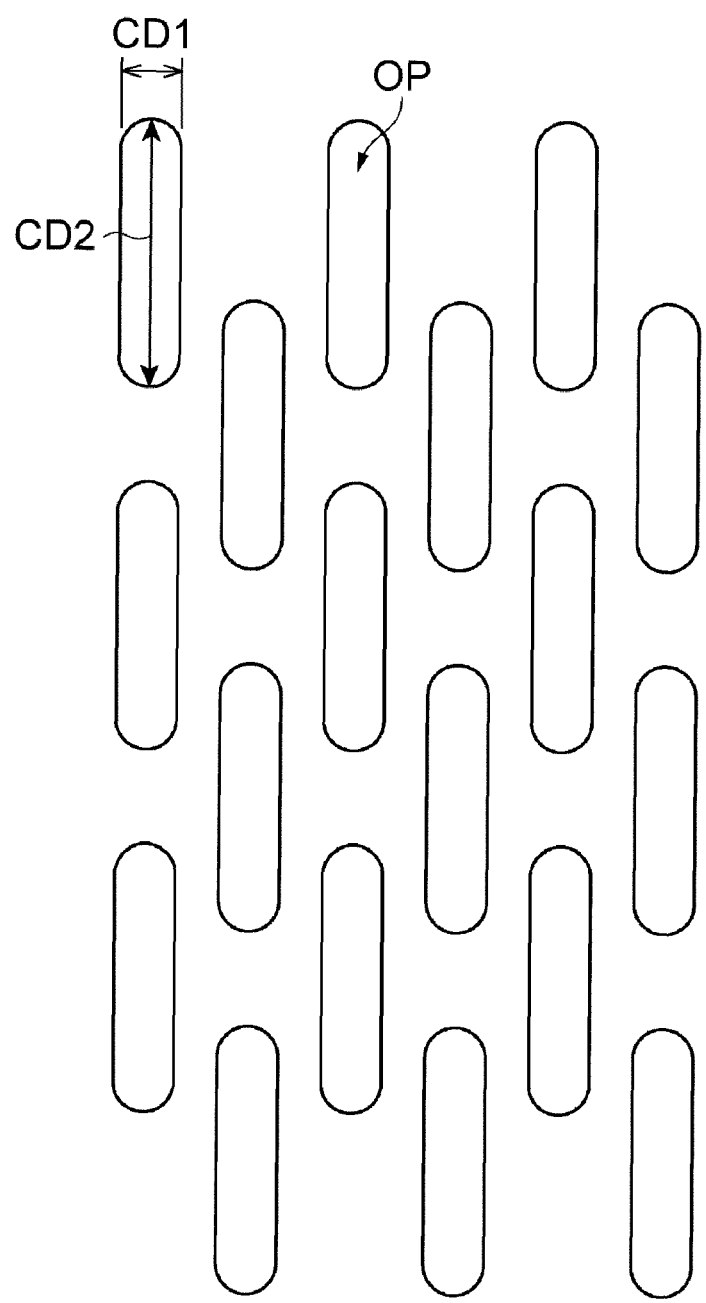
FIG. 11 is a plane view illustrating a pattern of a mask MK1 used in the experiment.

In the experimental example 4, as shown in FIG. 11, wafers W as samples 1 to 4 each including a mask MK1 in which multiple elliptical openings OP are arranged in a two-dimensional manner are prepared. A width CD1 of the opening OP of each sample in a minor axis direction and a width CD2 thereof in a major axis direction are set to be different from CD1 and CD2 of other samples. Further, the process ST2 and the sequence SQ1 are performed on the samples 1 to 4 by using the plasma processing apparatus 10. Furthermore, in the experimental example 4, the number of times of performing the sequence SQ1 is varied as a parameter. The conditions for the process ST2 and the sequence SQ1 performed in the experimental example 4 are described as follows.

Figure 12:
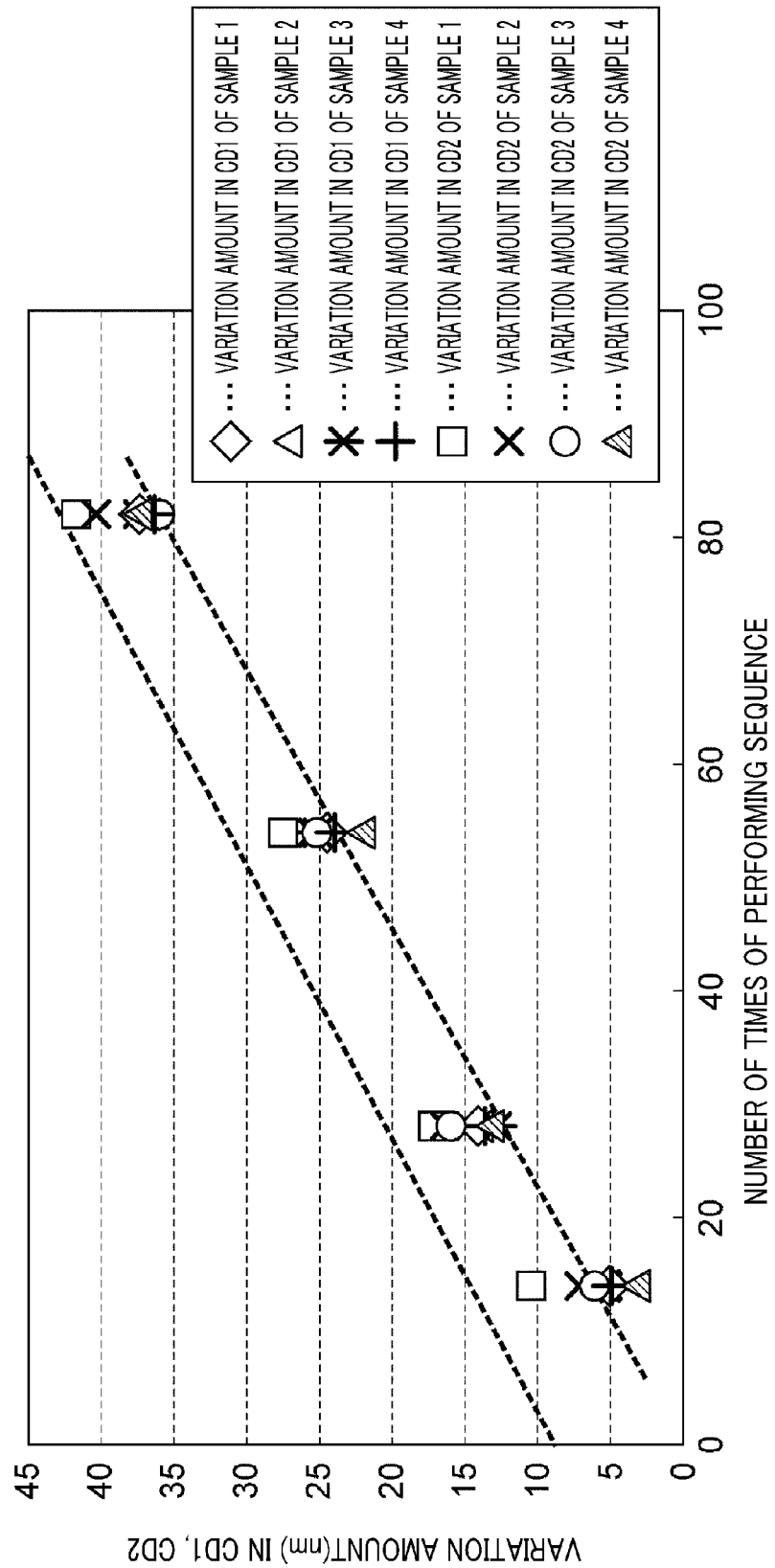
FIG. 12 is a graph illustrating results of experiments.

<Conditions for Process ST2>
Pressure in the processing vessel: 50 mTorr (6.66 Pa)
Hydrogen gas flow rate: 100 sccm
Ar gas flow rate: 800 sccm
High frequency power (supplied to the upper electrode 30) from the first high frequency power supply 62: 60 MHz, 300 W
High frequency bias power from the second high frequency power supply 64: 13 MHz, 0 W
Voltage applied from the power supply 70: −1000V
Processing time: 60 seconds <Conditions for Process ST3>
Pressure in the processing vessel: 200 mTorr (26.66 Pa)
$SiCl_4$ gas flow rate: 20 sccm
Ar gas flow rate: 200 sccm
High frequency power (supplied to the upper electrode 30) from the first high frequency power supply 62: 60 MHz, 100 W
High frequency bias power from the second high frequency power supply 64: 13 MHz, 0 W
Processing time: 5 seconds <Conditions for Process ST5>
Pressure in the processing vessel: 200 mTorr (26.66 Pa)
Oxygen gas flow rate: 200 sccm
Ar gas flow rate: 200 sccm
High frequency power (supplied to the upper electrode 30) from the first high frequency power supply 62: 60 MHz, 500 W
High frequency bias power from the second high frequency power supply 64: 13 MHz, 0 W
Processing time: 5 seconds Further, with respect to each of the samples 1 to 4, a relationship between the number of times of performing the sequence SQ1 and a variation amount in the width CD1 of the opening OP in the minor axis direction, and a relationship between the number of times of performing the sequence SQ1 and a variation amount in the width CD2 of the opening OP in the major axis direction are obtained. Results thereof are shown in FIG. 12. In FIG. 12, a horizontal axis represents the number of times of performing the sequence SQ1 and a longitudinal axis represents the variation amount in CD1 and CD2. As shown in FIG. 12, according to the result of the experimental example 4, the variation amount in the width CD1 of the opening OP in the minor axis direction and the variation amount in the width CD2 of the opening OP in the major axis direction are increased according to the increase in the number of times of performing the sequence SQ1. Thus, it is confirmed that it is possible to uniformly reduce the width of the elliptical opening in any direction depending on the number of times of performing the sequence SQ1.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:
1. A method of processing a target object including an etching target layer, an organic film prepared on the etching target layer, a silicon-containing antireflection film prepared on the organic film, and a first mask formed of a resist material and prepared on the antireflection film, the method comprising:
  a process of forming a silicon oxide film on the first mask and the antireflection film within a processing vessel of a plasma processing apparatus in which the target object is accommodated, the silicon oxide film including a first region formed on a top surface of the first mask, a second region formed on the antireflection film, and a third region formed on a side surface of the first mask,
    wherein the plasma processing apparatus is a capacitively coupled plasma processing apparatus that includes an upper electrode having an electrode plate formed of silicon;
  a process of forming a second mask having an opening based on the third region by removing the first region and the second region with plasma generated within the processing vessel;
  a process of removing the first mask with plasma generated within the processing vessel;
  a process of etching the antireflection film with plasma generated within the processing vessel;
  a process of forming a third mask formed of organic film region by etching the organic film with plasma generated within the processing vessel,
  wherein, in the process of forming the silicon oxide film, the silicon oxide film is formed by performing a sequence including:
    a first process of generating plasma of a first gas including a silicon halide gas and forming a reaction precursor within the processing vessel accommodating therein the target object,
    a second process of purging a space within the processing vessel,
    a third process of generating plasma of a second gas including an oxygen gas and forming the silicon oxide film within the processing vessel,
    a fourth process of purging the space within the processing vessel, and
  wherein, in the process of forming the silicon oxide film, the sequence including the first process, the second process, the third process, and the fourth process is repeatedly performed,
    wherein a width of the opening of the second mask is adjusted depending on the number of times of performing the sequence, and
  a process of irradiating secondary electrons to the first mask by generating plasma of a third gas including a hydrogen gas within the processing vessel and applying a negative DC voltage to the upper electrode of the plasma processing apparatus, before performing the process of forming the silicon oxide film,
    wherein an absolute value of the negative DC voltage is controlled such that the silicon of the electrode plate is released together with the secondary electrode when cations in the processing vessel collide with the electrode plate, and the silicon released from the electrode plate is bonded to oxygen released from a component of the plasma processing apparatus exposed to the plasma of the third gas such that a silicon oxide compound is produced and is deposited on the target object to cover the first mask.

2. The method of claim 1,
wherein the first process is performed under a high-pressure and low-power condition in which a pressure within the processing vessel is 13.33 Pa or more and a power from a power supply for plasma generation is 100 W or less.

3. The method of claim 1,
wherein, in the first process, a bias power for ion attraction is not applied to a placing table configured to support the target object.

4. The method of claim 1, further comprising:
a process of forming another silicon oxide film on the third mask and the etching target layer within the processing vessel, the another silicon oxide film including a fourth region formed on a top surface of the third mask, a fifth region formed on the etching target layer, and a sixth region formed on a side surface of the third mask;
a process of forming a fourth mask based on the sixth region by removing the fourth region and the fifth region with the plasma generated within the processing vessel; and
a process of removing the third mask with plasma generated within the processing vessel,
wherein, in the process of forming the another silicon oxide film, the another silicon oxide film is formed by performing a sequence including:
  a fifth process of generating plasma of a fourth gas including a silicon halide gas and forming a reaction precursor within the processing vessel accommodating therein the target object;
  a sixth process of purging the space within the processing vessel;
  a seventh process of generating plasma of a fifth gas including an oxygen gas and forming the another silicon oxide film within the processing vessel; and
  an eighth process of purging the space within the processing vessel.

5. The method of claim 4,
wherein, in the process of forming the another silicon oxide film, the sequence including the fifth process, the sixth process, the seventh process, and the eighth process is repeatedly performed.

6. The method of claim 4,
wherein the fifth process is performed under a high-pressure and low-power condition in which a pressure within the processing vessel is 13.33 Pa or more and a power from a power supply for plasma generation is 100 W or less.

7. The method of claim 4,
wherein, in the fifth process, a bias power for ion attraction is not applied to a placing table configured to support the target object.

8. The method of claim 4, further comprising:
a process of irradiating secondary electrons to the third mask by generating plasma within the processing vessel and applying a negative DC voltage to an upper electrode of the plasma processing apparatus, before performing the process of forming the another silicon oxide film.

9. The method of claim 1, further comprising:
a process of etching the etching target layer with plasma generated within the processing vessel.

10. The method of claim 1, wherein the silicon halide gas is a $SiCl_4$ gas.

* * * * *